US011490534B1

(12) United States Patent
Feijoo

(10) Patent No.: US 11,490,534 B1
(45) Date of Patent: Nov. 1, 2022

(54) ELEVATED EQUIPMENT INSTALLATION APPARATUS

(71) Applicant: Mount IT, LLC, Tarpon Springs, FL (US)

(72) Inventor: Roland Feijoo, Tarpon Springs, FL (US)

(73) Assignee: MOUNT IT, LLC, Tarpon Springs, FL (US)

( * ) Notice: Subject to any disclaimer, the term of this patent is extended or adjusted under 35 U.S.C. 154(b) by 0 days.

(21) Appl. No.: 17/655,101

(22) Filed: Mar. 16, 2022

(51) Int. Cl.
| | | |
|---|---|---|
| *H05K 5/02* | (2006.01) | |
| *H01R 33/00* | (2006.01) | |
| *H01R 43/26* | (2006.01) | |
| *F16M 13/02* | (2006.01) | |
| *H04W 88/08* | (2009.01) | |
| *H01R 13/516* | (2006.01) | |
| *G03B 17/56* | (2021.01) | |

(52) U.S. Cl.
CPC ............. *H05K 5/023* (2013.01); *F16M 13/02* (2013.01); *H01R 33/00* (2013.01); *H01R 43/26* (2013.01); *F16M 2200/02* (2013.01); *G03B 17/561* (2013.01); *H01R 13/516* (2013.01); *H04W 88/08* (2013.01); *H05K 5/0247* (2013.01)

(58) Field of Classification Search
CPC ...... H05K 5/023; H05K 5/0247; F16M 13/02; F16M 2200/02; H01R 33/00; H01R 43/26; H01R 13/516; G03B 17/561
USPC ...................................... 361/679.01
See application file for complete search history.

(56) References Cited

U.S. PATENT DOCUMENTS

| | | | |
|---|---|---|---|
| 8,585,345 B2 | 11/2013 | Sikorski et al. | |
| 8,745,954 B2 | 6/2014 | Simmons | |
| 9,451,133 B2 * | 9/2016 | Stark | G03B 17/561 |
| 9,692,951 B2 * | 6/2017 | Stark | H04N 5/2252 |
| 10,307,313 B2 | 6/2019 | Schroeder et al. | |
| 10,175,563 B2 | 8/2019 | Matt | |
| 10,906,474 B2 * | 2/2021 | Chou | B60R 11/0235 |
| 11,066,004 B2 | 7/2021 | Schroeder et al. | |
| 2015/0301560 A1 * | 10/2015 | Garland, Sr. | G03B 17/561 |
| | | | 455/575.8 |

FOREIGN PATENT DOCUMENTS

| | | | | |
|---|---|---|---|---|
| CN | 1222823 C | * | 10/2005 | ....... G08B 13/19619 |
| CN | 105480251 A | | 4/2016 | |
| CN | 211642042 U | * | 10/2020 | |
| CN | 211694068 U | * | 10/2020 | |

(Continued)

*Primary Examiner* — Peter G Leigh
(74) *Attorney, Agent, or Firm* — Smith & Hopen, P.A.; Owen Behrens

(57) ABSTRACT

Described, herein, is an installation apparatus and method which may permit the safe and rapid mounting of an electrical device (e.g., a Wi-Fi access point or a surveillance camera) onto an elevated support surface (e.g., a wall, a post, or a ceiling). Accordingly, the installation apparatus may include a housing, a mount, and an elongated handle. During use, the mount may be configured to be affixed to the elevated support surface. Additionally, the elongated handle may be configured to selectively couple to the housing enabling a user to lift the housing to the mount on the elevated support surface. Subsequent to the user lifting the housing to the mount, the housing may be configured to selectively couple to the housing, securing the housing to the mount.

20 Claims, 12 Drawing Sheets

(56) References Cited

FOREIGN PATENT DOCUMENTS

| CN | 214037504 U | * | 8/2021 |
| CN | 214335223 U | * | 10/2021 |
| CN | 216002443 U | * | 3/2022 |

* cited by examiner

ELEVATED EQUIPMENT INSTALLATION APPARATUS

BACKGROUND OF THE INVENTION

1. Field of the Invention

This invention relates, generally, to mounting equipment. More specifically, it relates to an installation apparatus and method for electrical devices on elevated support surfaces.

2. Brief Description of the Prior Art

The mounting of equipment and devices onto elevated support surfaces (e.g., a ceiling, a post, or a wall) is dependent on the manufacturer's mounting locations on those structures for securing such equipment and devices. This may require individual adaptation for each piece of equipment or device to mount to these specific locations which may be time consuming and require significant touch labor. Furthermore, if the piece of equipment or device is desired to moved or required to be replaced, the amount of time and effort is increased to remove and remount the piece of equipment or device in a new location. The amount of effort to individually adapt the equipment and devices increases for mobile applications.

For electronic equipment disposed in areas that required substantially high elevation, such as a wall or a ceiling of a warehouse, to the task of servicing the electronic equipment entails significant difficulty. Moreover, warehouse safety requirements do not permit the use of a ladder to reach equipment positioned above a certain height. Therefore, a scissor lift, or a similar type of machinery, may be required to service electronic equipment installed at a high elevation. The cost associated with deployment of may exceed the cost of the electronic equipment being serviced.

Therefore, what is needed is a safe, efficient, and readily replaceable installation apparatus for electric devices that are mounted at elevated support surfaces. However, in view of the art considered as a whole at the time the present invention was made, it was not obvious to those of ordinary skill in the field of this invention how the shortcomings of the prior art could be overcome.

SUMMARY OF THE INVENTION

The unresolved need stated above is now met by a novel and non-obvious invention disclosed and claimed herein. In an aspect, the invention pertains to an installation apparatus for mounting an electrical device (e.g., a Wi-Fi access point or a security camera) onto an elevated support surface (e.g., a wall, a post, or a ceiling). The installation apparatus has a mount that is configured to be affixed to the elevated support surface. The mount has a distal portion and a proximal portion separated by a first distance forming a first opening therebetween. The installation apparatus further includes a first connector holder coupled to the mount, such that the first connector holder is configured to retain a first electrical connector. The first electrical connector is connected to an electrical cable, which may be disposed along an elevated support surface, for example on a support structure or concealed behind a wall.

The installation apparatus further includes a housing configured to be coupled to the electrical device. The housing includes a tongue having a width less than the first distance, such that the tongue is configured to enter the mount through the first opening between the distal and proximal portions thereof. Additionally, a second connector holder is coupled to the housing and is configured to retain a second electrical connector. In an embodiment, an edge of the tongue is beveled to facilitate entry of the tongue into the first opening.

In an embodiment, the second electrical connector is in electrical communication with the electrical device. Furthermore, the second connector holder is configured to retain the second electrical connector in an orientation facilitating alignment of the second electrical connector with the first electrical connector when the housing is coupled to the mount. In this embodiment, when the tongue of the housing is positioned between the distal and proximal portions of the mount, the second electrical connector and the first electrical connector become electrically coupled with one another, enabling an electrical current to flow between the electrical cable and the electrical device.

The installation apparatus may further include an elongated handle having a proximal end and a distal end. The distal end may be configured to selectively couple to the housing, such that the elongated handle enables a user to lift the housing to a position relative to the mount where the tongue of the housing is aligned with the first opening of the mount. In this manner, when the tongue enters the first opening, the housing becomes coupled to the mount.

The distal end of the elongated handle may be configured to couple to the housing via a coupling mechanism. The coupling mechanism may involve a screwthreaded engagement, a magnetic engagement, a bias pin, a friction fit, or a combination thereof.

Another feature of the installation apparatus is that the installation apparatus may comprise a locking member. The locking member has an engaged position, in which the locking member immobilizes the housing relative to the mount, and a disengaged position, in which the tongue of the housing can be removed from mount via the first opening between the proximal and distal portions thereof. In an embodiment, the act of coupling of the distal end of the elongated handle to the housing transitions the locking member into the disengaged position, thereby releasing the housing from the mount. As used herein, the term "locking member" refers to any component that is configured to selectively immobilize the housing in a coupled configuration relative to the mount. The locking member may be a biased component, a threaded screw, a switch, a bias pin, a stopper, a band, a clip, or a combination thereof.

In another embodiment, the installation apparatus may further include a tether. The tether may have a first end, affixed to the housing, and a second end, selectively anchored to an anchoring fixture. Moreover, the housing and the electronic device affixed thereto may be belayed via the tether by releasing the second end of the tether from the anchoring fixture and removing the housing from the mount.

In another aspect, the invention pertains to a method of mounting an electric device to an elevated support surface using the installation apparatus disclosed above.

The method comprises, coupling an elongated handle to a housing coupled to the electrical device. Next, the elongated handle is used to manipulate the housing to align the tongue of the housing with an opening between the proximal and distal portions of the mount affixed to the elevated support surface. The mount and the housing have complementary electrical connectors that are configured to mate with one another when the housing is coupled to the mount. In this manner, the electrical device establishes an electrical connection with an electrical cable, via the first and the second electrical connectors, thereby enabling an electrical current to flow between the electrical cable and the electrical device. Finally, the method comprises releasing the housing from the elongated handle, such that the elongated handle is decoupled from the housing.

In addition, the method may further include locking the housing to the mount, via a locking member. The locking member has an engaged position, in which the locking member immobilizes the housing relative to the mount, and a disengaged position, in which the tongue of the housing is removable from mount via the first opening thereof.

Additionally, the method may further include anchoring the housing to the mount, via a tether, such that a first end of the tether is coupled to the housing and a second end of the tether is anchored to an anchoring fixture. When the second end of the tether is released from the anchoring fixture and the housing is removed from the mount, the housing and the electronic device affixed thereto can be belayed with the tether.

Furthermore, the method may further include replacing the housing, via the elongated handle, such that the elongated handle is coupled to the housing, enabling the user to remove the housing from the mount. The housing is belayed from the mount to a ground surface, allowing the first end of the tether and the elongated handle to be selectively decoupled from the housing and subsequently selectively coupled to a replacement housing.

Additional aspects and advantages of the present disclosure will become readily apparent to those skilled in the art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not restrictive.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

In the following detailed description of the preferred embodiments, reference is made to the accompanying drawings, which form a part thereof, and within which are shown by way of illustration specific embodiments by which the invention may be practiced. It is to be understood that one skilled in the art will recognize that other embodiments may be utilized, and it will be apparent to one skilled in the art that structural changes may be made without departing from the scope of the invention. Elements/components shown in diagrams are illustrative of exemplary embodiments of the disclosure and are meant to avoid obscuring the disclosure. Any headings, used herein, are for organizational purposes only and shall not be used to limit the scope of the description or the claims. Furthermore, the use of certain terms in various places in the specification of for illustration and should not be construed as limiting.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. The appearances of the phrases "in one embodiment," "in an embodiment," "in another embodiment," "in embodiments," "in alternative embodiments," "in an alternative embodiment," or "in some embodiments" in various places in the specification are not necessarily all referring to the same embodiment or embodiments. The terms "include," "including," "comprise," and "comprising" shall be understood to be open terms and any lists that follow are examples and not meant to be limited to the listed items.

As used in this specification and the appended claims, the singular forms "a," "an," and "the" include plural referents unless the content clearly dictates otherwise. As used in this specification and the appended claims, the term "or" is generally employed in its sense including "and/or" unless the context clearly dictates otherwise.

Figure 1:
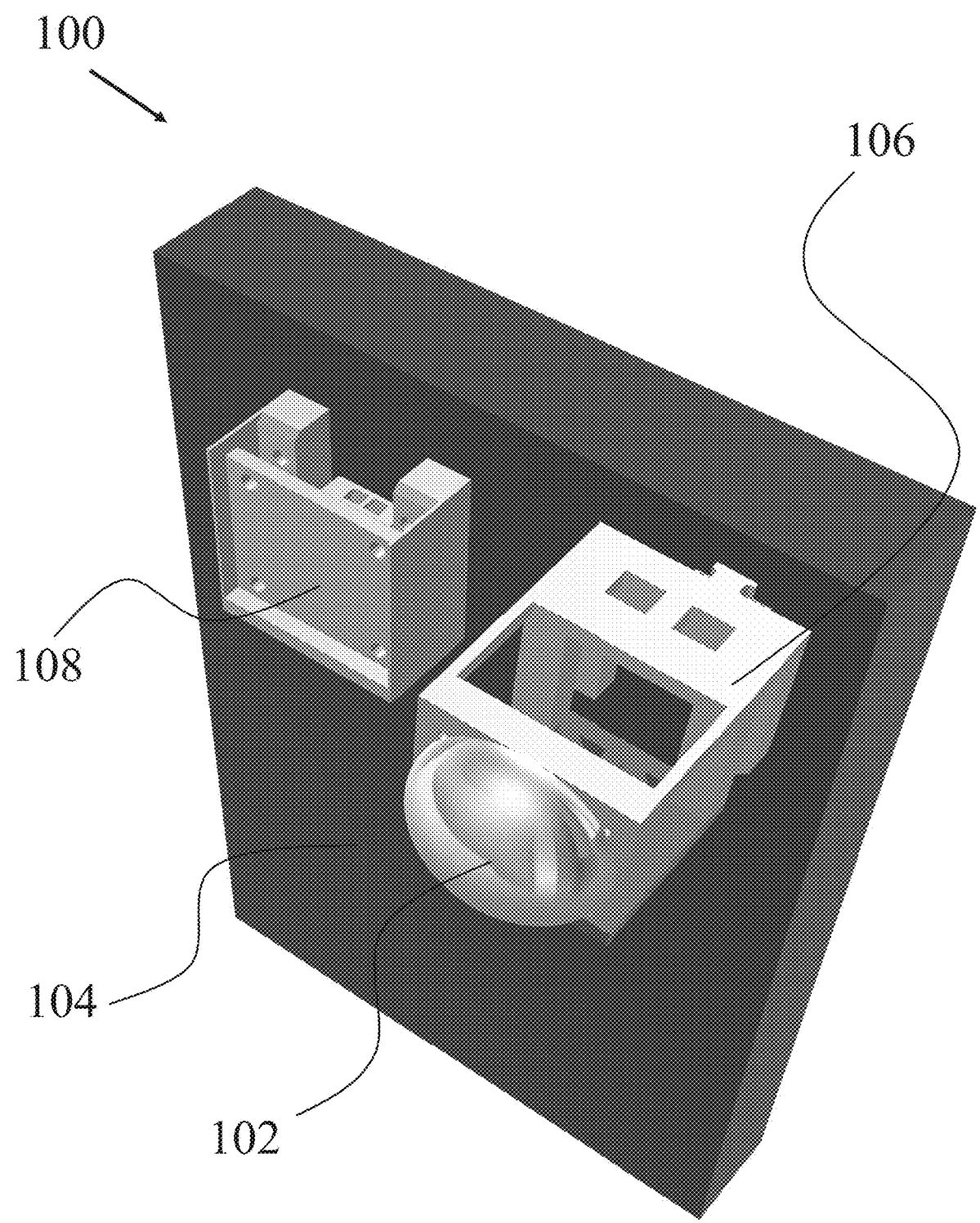
FIG. 1 is a perspective view of an installation apparatus according to an embodiment of the present disclosure.
Figure 4:
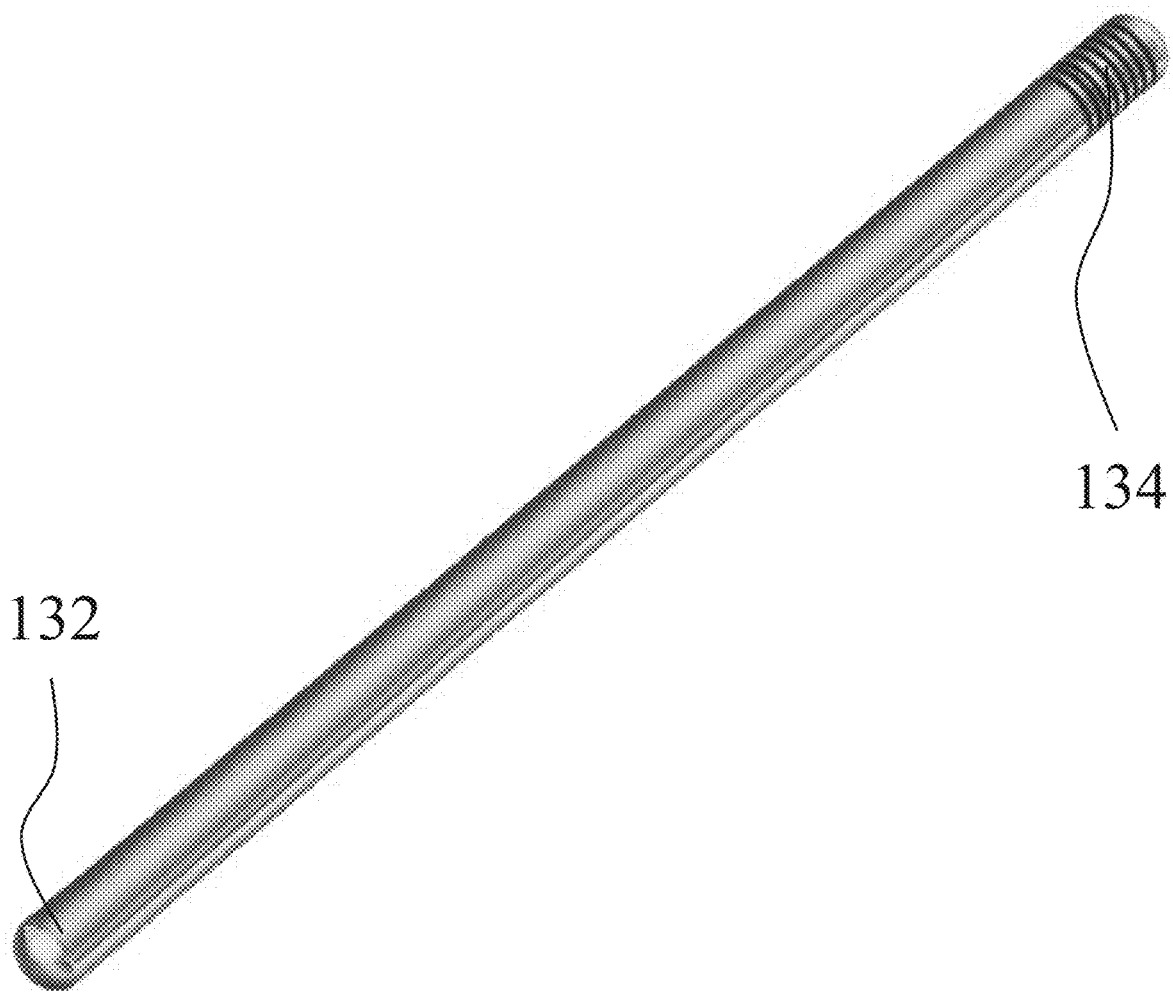
FIG. 4 is a is a perspective view of an elongated handle according to an embodiment of the present disclosure.

The present disclosure pertains to using an installation apparatus 100 to mount an electric device 102 to an elevated support surface 104. Some examples of electric device 102 may include a Wi-Fi access point or a security camera. As shown in FIG. 1 and FIG. 4, installation apparatus 100 includes a housing 106 temporarily coupled to a mount 108. Electric device 102 is selectively coupled to housing 106. Installation apparatus 100 further includes an elongated handle 110, which selectively couples to housing 106, enabling a user to lift and manipulate housing 106.

Figure 2:
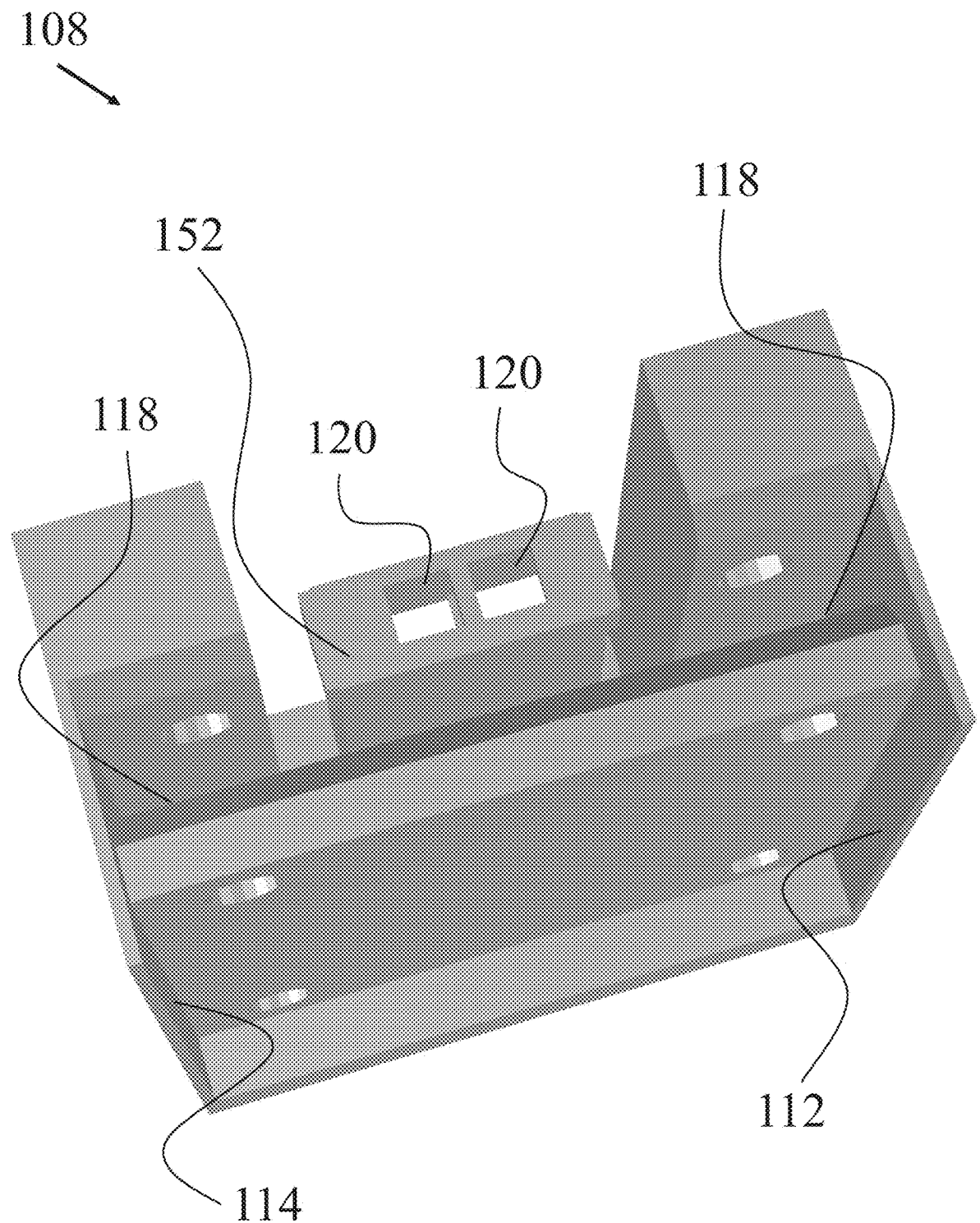
FIG. 2 is a perspective view of a mount according to an embodiment of the present disclosure.

FIG. 2, in conjunction with FIG. 1, depicts mount 108 according to an embodiment of the invention. In this embodiment, mount 108 is configured to be affixed to the elevated support surface 102. Mount 108 has a distal portion 112 and a proximal portion 114, in which distal portion 112 and proximal portion 114 are separated by a first distance forming a first opening 118 therebetween. The installation apparatus 100 further includes a first connector holder 152 coupled to mount 108 and is configured to retain a first electrical connector 120. First electrical connector 120 is in electrical communication with an electrical cable, for example, an ethernet cable, a high-voltage power cable, or a low-voltage data cable.

Figure 3:
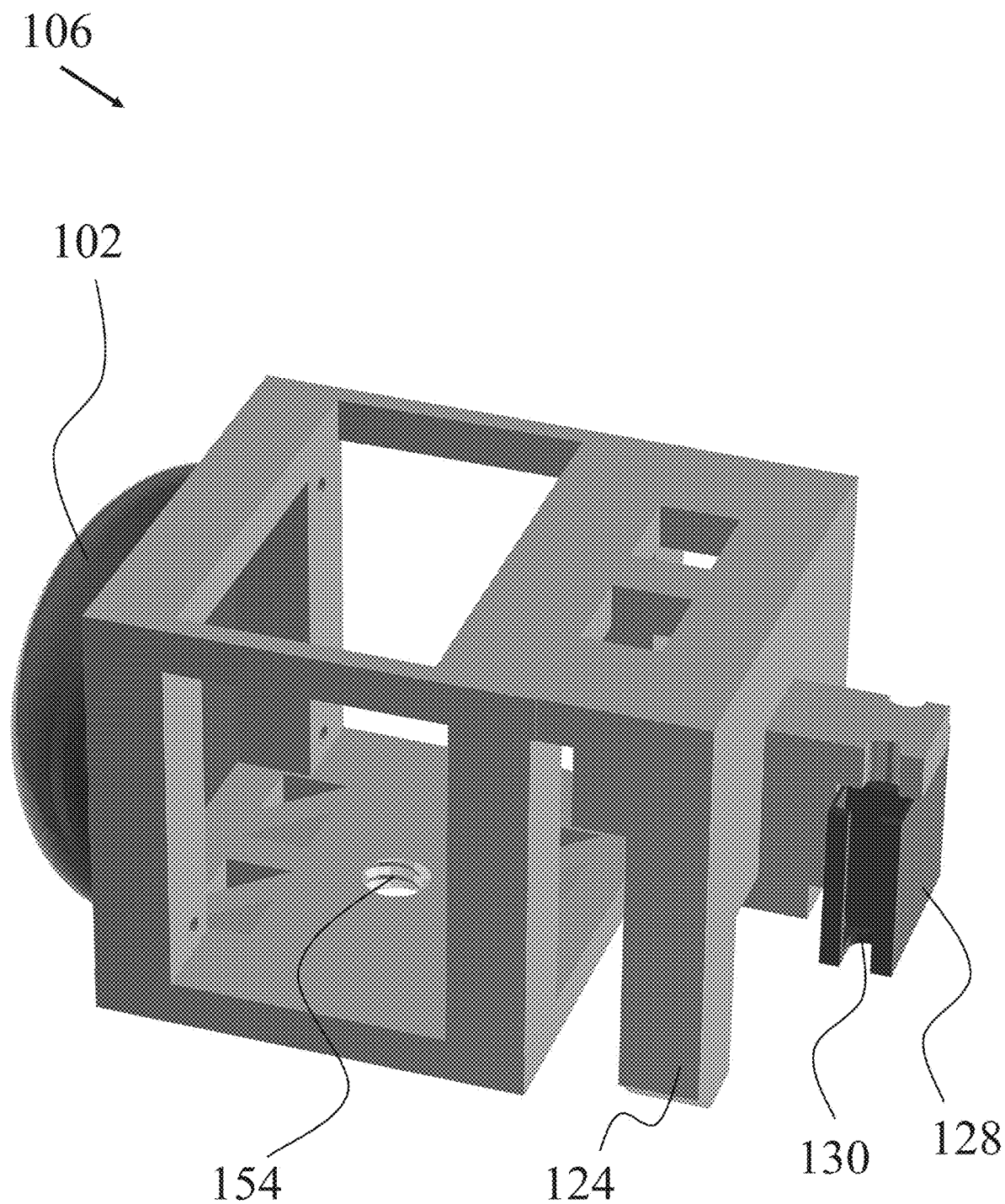
FIG. 3 is a perspective view of a housing according to an embodiment of the present disclosure.

Next, FIG. 3, in conjunction with FIG. 2, depicts a housing 106 according to an embodiment of the invention. Housing 106 includes a tongue 124 having a width. The width of tongue 124 is less than the first distance of mount 108, such that tongue 124 is configured to enter mount 108 through first opening 118 between distal portion 112 and proximal portion 114 thereof. A second connector holder 128 is coupled to housing 106 and is configured to retain a second electrical connector 130. FIG. 3 depicts that one or more edges and/or corners of tongue 124 may be beveled to facilitate entry of tongue 124 into first opening 118.

FIG. 4, in conjunction with FIGS. 1-3, depicts elongated handle 110 according to an embodiment of the invention. Elongated handle 110 has a proximal end 132 and a distal end 134. Distal end 134 may be configured to selectively couple to housing 106, via a coupling mechanism 154, enabling a user to lift housing 106 to a position relative to mount 108 where tongue 124 of housing 106 becomes aligned with first opening 118 of the mount 108. When tongue 124 is inserted into opening 118, housing 106 becomes coupled to mount 108. Elevated support surface 104 may be perpendicular or parallel with respect to a ground surface. Furthermore, elevated support surface 104 may be disposed diagonally or in any other orientation with respect to the ground surface.

Coupling mechanism 154 may involve a screwthreaded engagement, a magnetic engagement, a bias pin, a friction fit, or a combination thereof. For ease of reference, the exemplary embodiment described herein refers to the screwthreaded engagement, but this description should not be interpreted as exclusionary of other types of coupling mechanisms 154.

Figure 5:
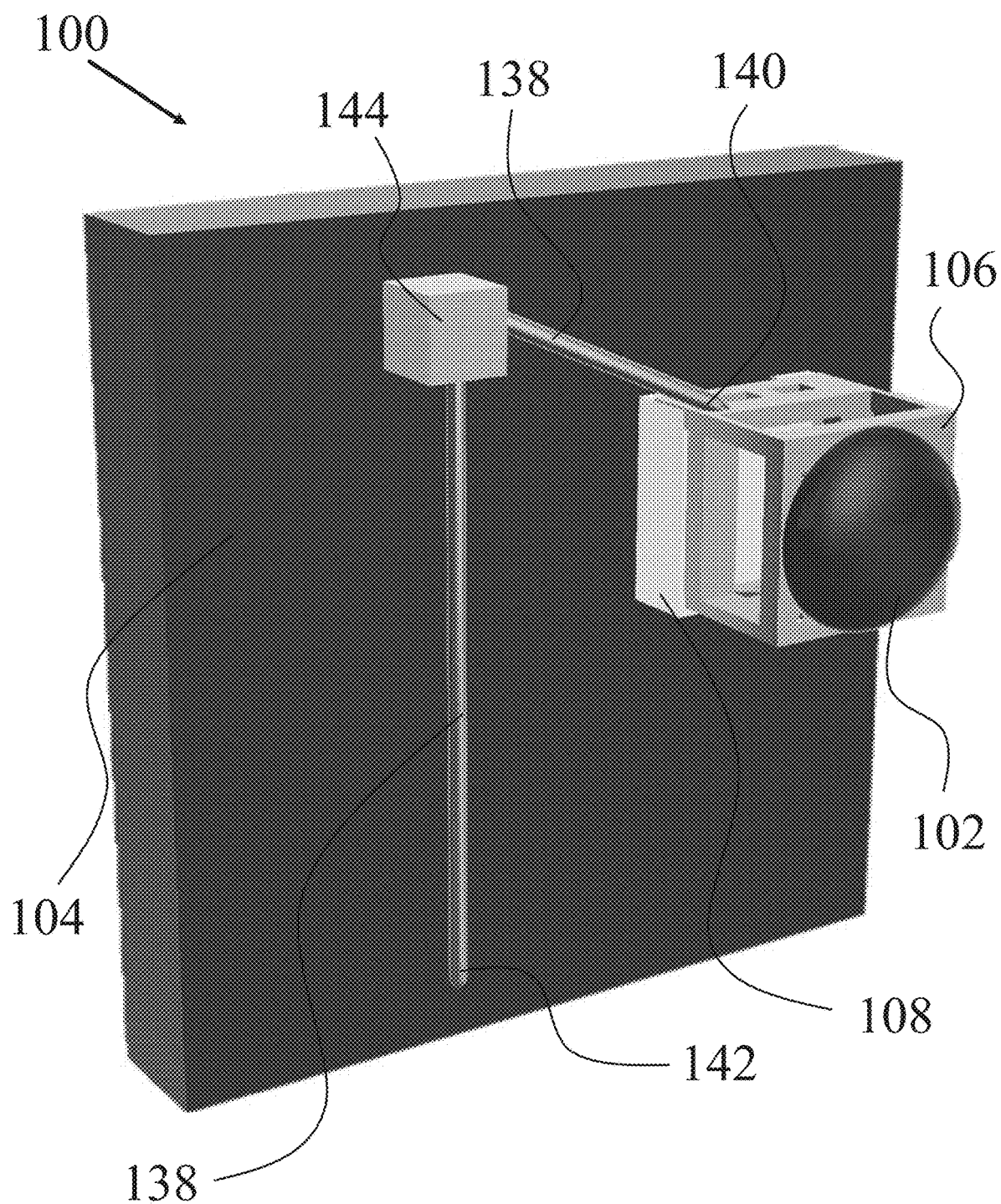
FIG. 5 is a perspective view of a housing coupled to a tether, according to an embodiment of the present disclosure.

As shown in FIG. 5, in conjunction with FIGS. 1-4, installation apparatus 100 includes a tether 138. Tether 138 has a first end 140 configured to be affixed to housing 106 and a second end 142 anchored to an anchoring fixture 144. In this embodiment, when second end 142 of tether 138 is released from anchoring fixture 144, and housing 106 is removed from mount 108, housing 106 and electronic device 102 coupled thereto may be belayed using tether 138.

As used herein, the term "tether" refers to any elongated flexible member that is used to restrict the movement of housing 106 relative to elevated support surface 104. The tether may be a dynamic rope, a static rope, an elastic string, a cable, or a combination of thereof. For ease of reference, the exemplary embodiment described herein refers to the dynamic rope, but this description should not be interpreted as exclusionary of other types of tethers.

As used herein, "anchoring fixture" refers to any device that is configured to affix at least a portion of tether 138 to elevated support surface 104. Anchoring fixture 144 may be a hook, an adhesive, a magnet, or a combination of thereof. For ease of reference, the exemplary embodiment described herein refers to the hook, but this description should not be interpreted as exclusionary of other anchoring fixtures.

Figure 6A:
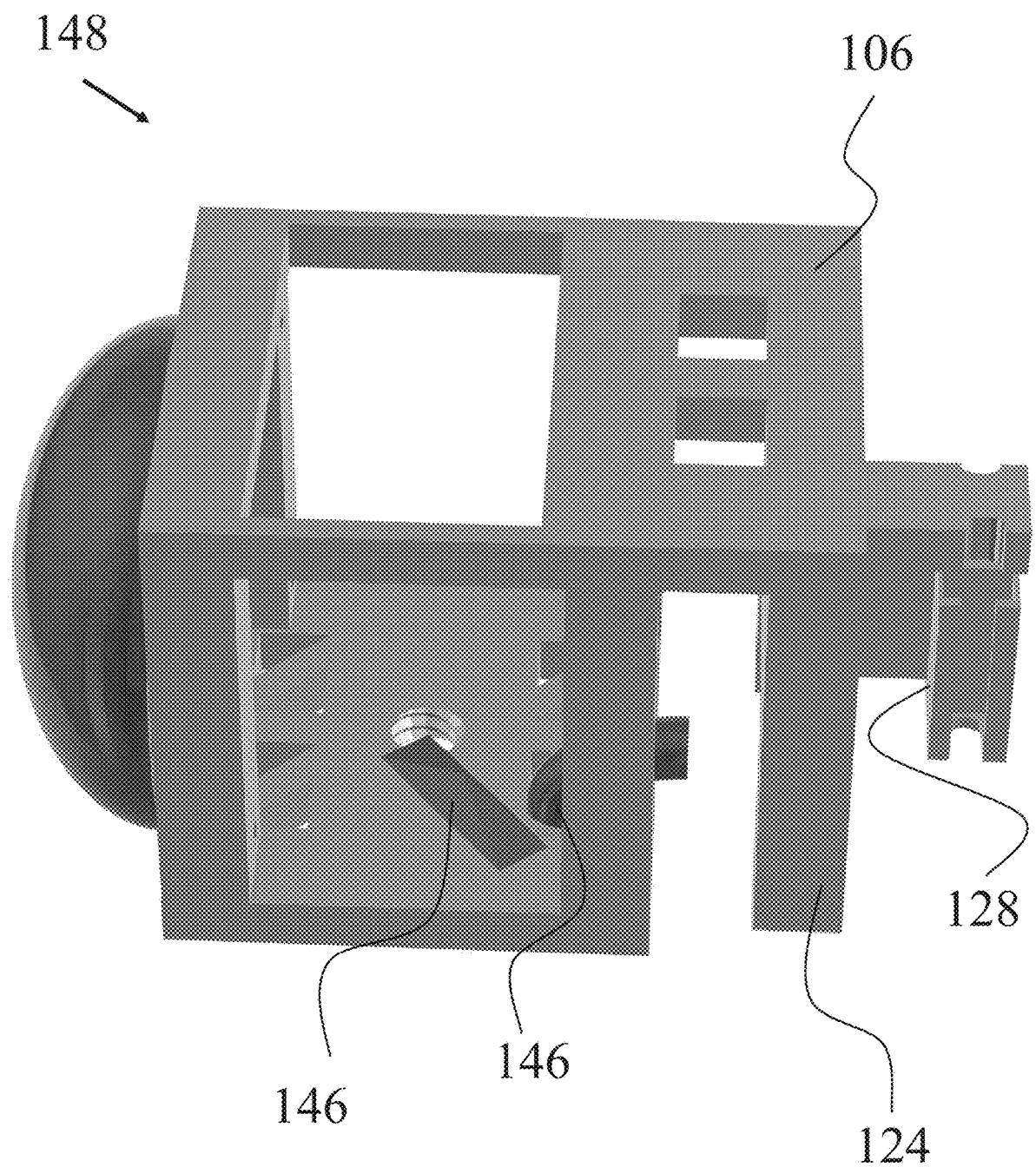
FIG. 6A is a perspective view of a locking member in an engaged position, according to an embodiment of the present disclosure.
Figure 6B:
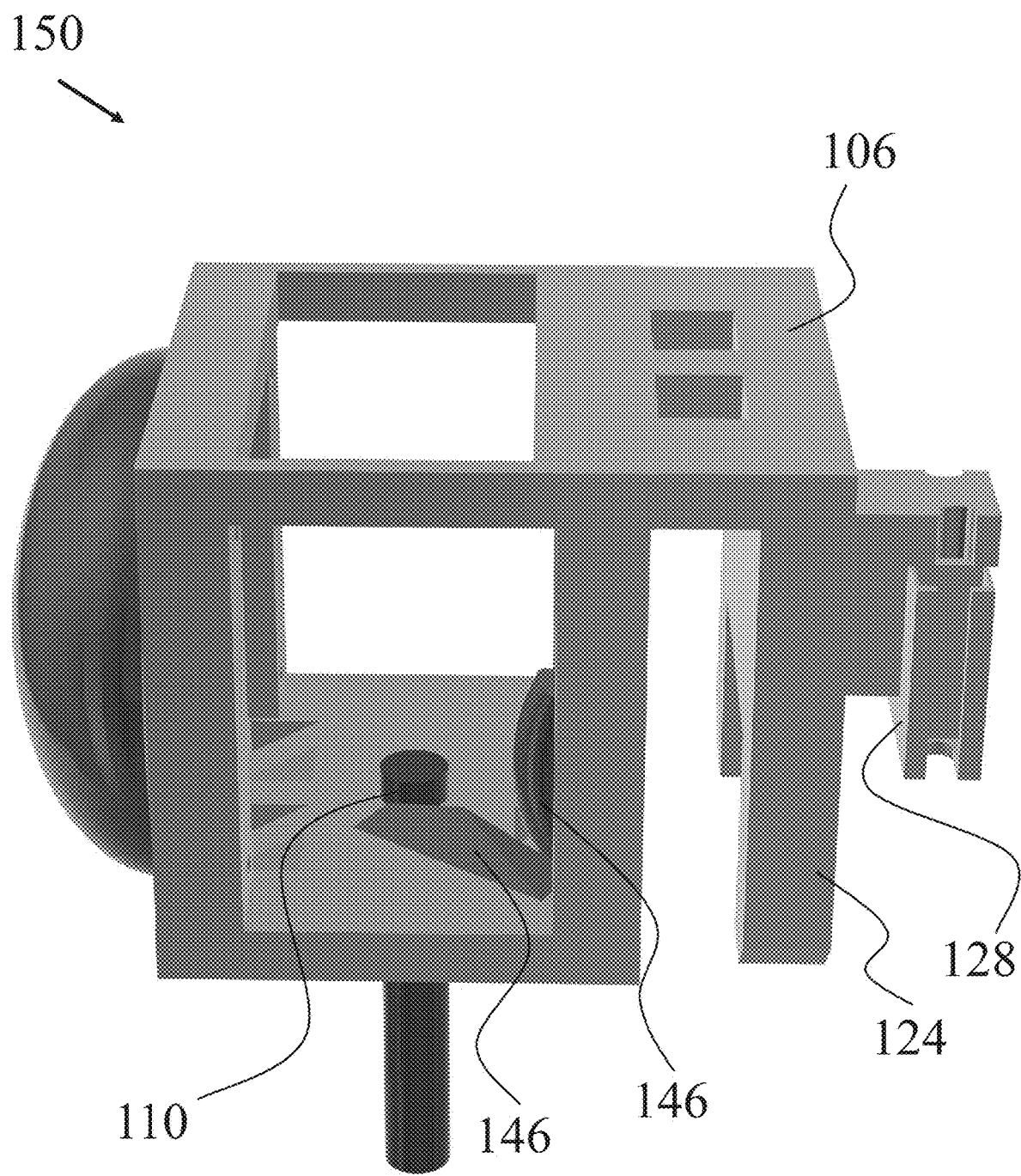
FIG. 6B is a perspective view of a locking member in a disengaged position, according to an embodiment of the present disclosure.

FIGS. 6A-6B, in conjunction with FIGS. 3-4, depict a locking member 146 disposed within housing 106. FIG. 6A depicts locking member 146 having an engaged position 148, in which locking member 146 immobilizes housing 106 relative to mount 108. As shown in FIG. 6B, locking member 146 has a disengaged position 150, in which locking member releases tongue 124 from mount 108, such that housing 106 can be removed from mount 108 via first opening 118. In this embodiment, the act of coupling distal end 134 of elongated handle 110 to housing 106 may transition locking member 146 into the disengaged position 150, releasing housing 106 from mount 108. In this manner, locking member 146 immobilizes housing 106 relative to mount 108 when elongated handle 110 is decoupled from housing 106, and releases housing 106 from mount 108 when elongated handle 110 is coupled to housing 106.

As used herein, the term "locking member" refers to a mechanical, electrical, or magnetic component that is configured to selectively immobilize and release housing 106 relative to mount 108. The locking member may be a biasing component, a threaded screw, a switch, a bias pin, a stopper, a band, a clip, or a combination thereof. For ease of reference, the exemplary embodiment described herein refers to a switch, but this description should not be interpreted as exclusionary of other immobilization components.

Figure 7A:
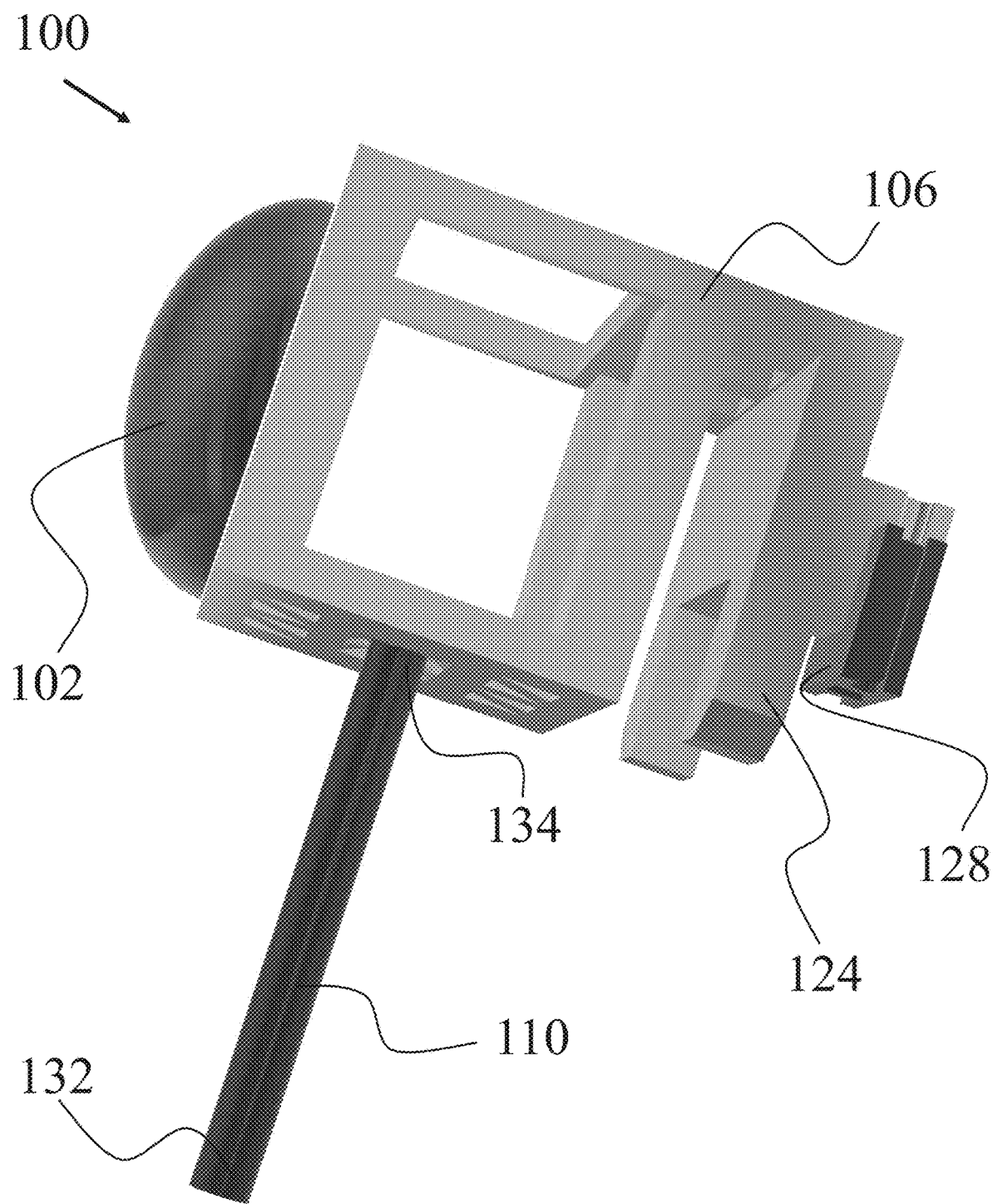
FIG. 7A is a perspective view of an elongated handle coupled to a housing according to an embodiment of the present disclosure.

Installation Cycle:

FIGS. 7A-7D depict a sequence of mounting electric device 102 to an elevated support surface 104 using an installation apparatus 100. FIG. 7A, in conjunction with FIGS. 6A-6B, depicts elongated handle 110 selectively coupled to housing 106. Elongated handle 110 has a proximal end 132 and a distal end 134. Locking member 146 is disposed within housing 106. Distal end 134 is configured to selectively couple to housing 106, such that locking member 146 transitions to disengaged position 150 when distal end 134 of elongated handle 110 is coupled to housing 106. FIG. 7A further depicts that, when elongated handle 110 is coupled to housing 106, a user can manipulate housing 106 using elongated handle 110. FIGS. 7A-7D further depict second connector holder 128 coupled to housing 106. Second connector holder 128 is configured to retain a second electrical connector 130.

Figure 7B:
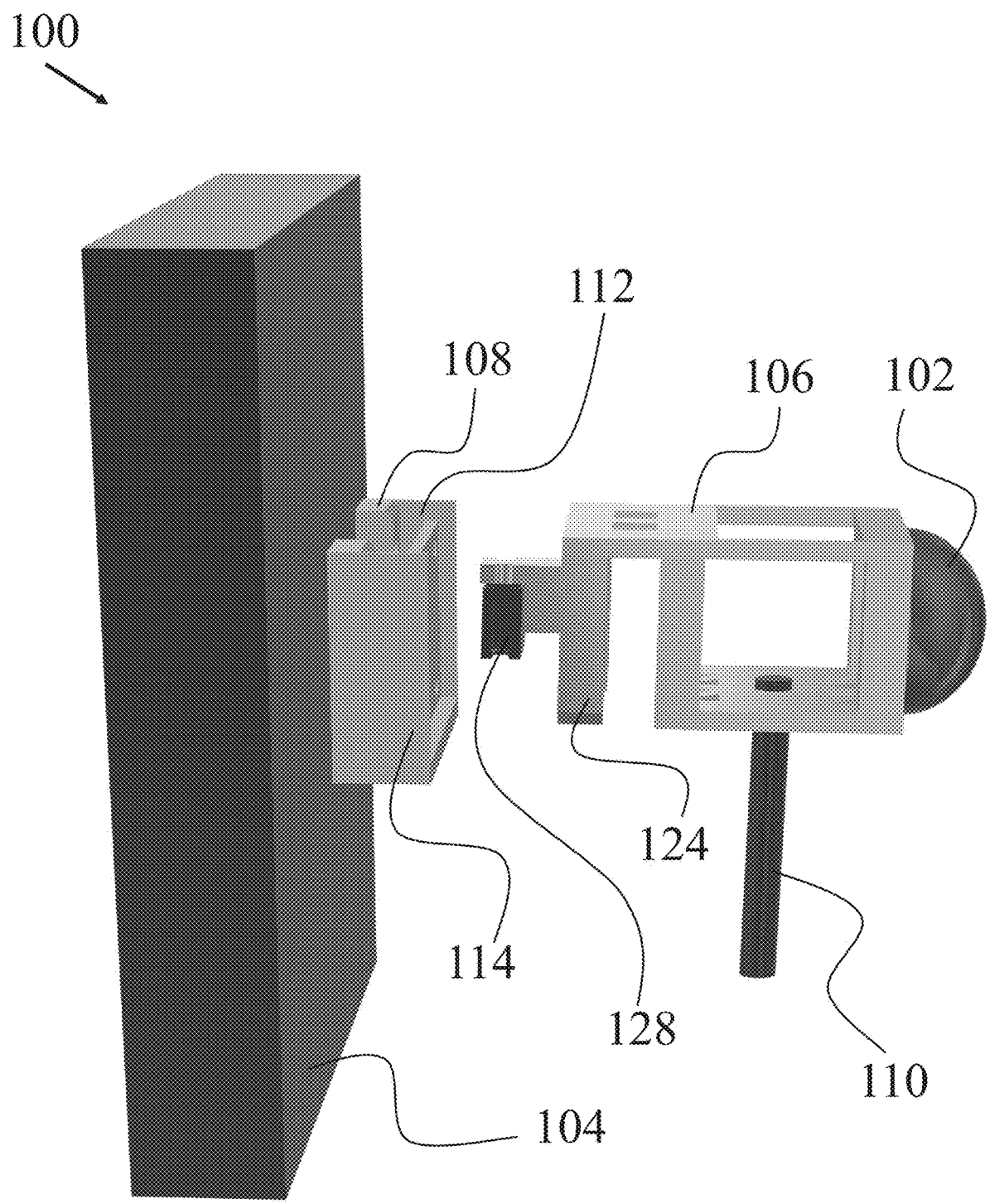
FIG. 7B is a perspective view of a housing, via an elongated handle, aligned with a mount, according to an embodiment of the present disclosure.

Manipulating elongated handle 110 coupled to housing 106, the user lifts housing 106 to a position aligned with mount 108, as depicted in FIG. 7B. The user manipulates elongated handle 100 to align tongue 124 of housing 106 with first opening 118 between distal portion 112 and proximal portion 114 of mount 108.

Figure 7C:
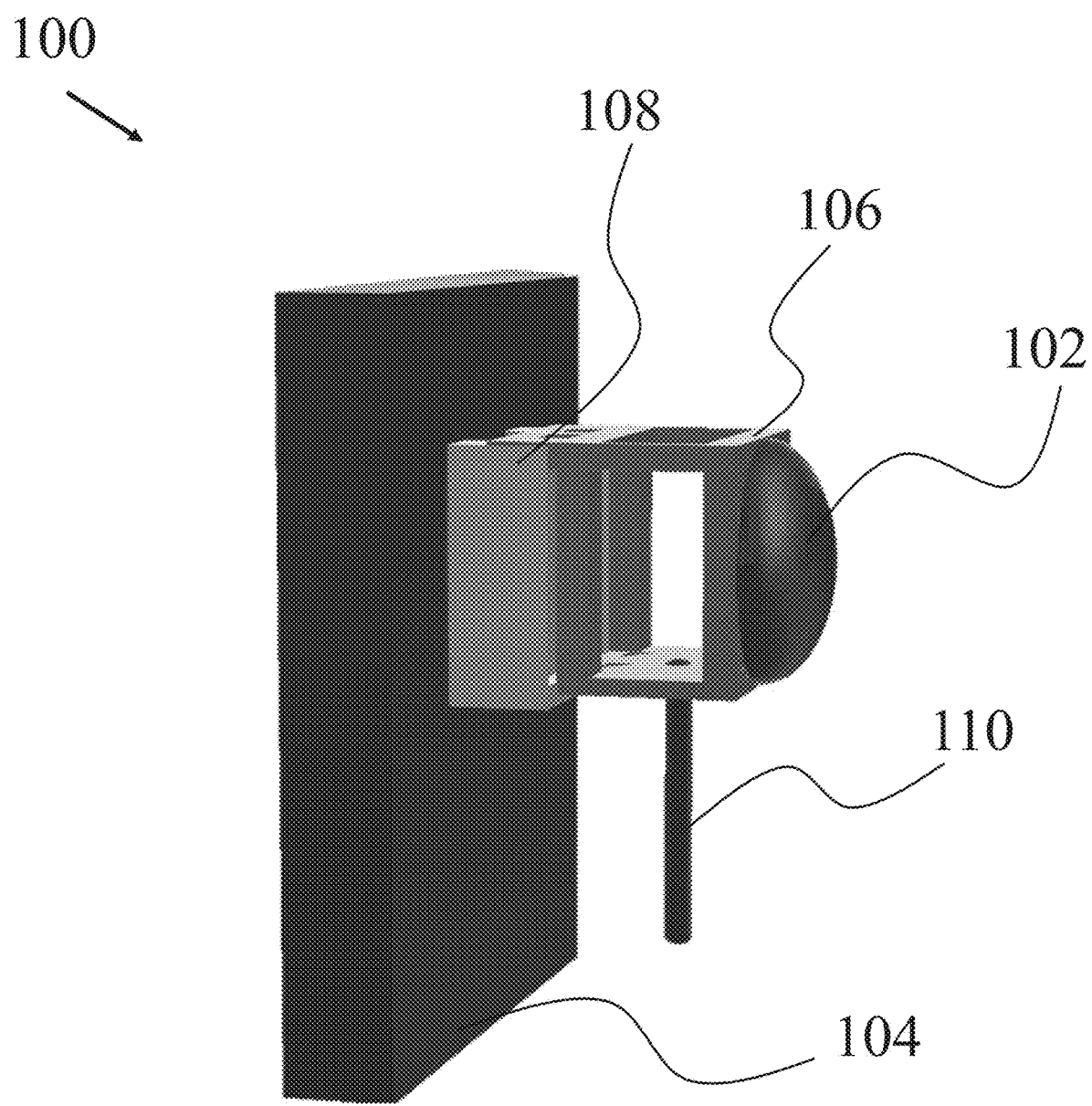
FIG. 7C is a perspective view of a housing selectively coupled to a mount, according to an embodiment of the present disclosure.

Next, FIG. 7C, in conjunction with FIGS. 2-3, depicts housing 106 coupled to mount 108. At this point, tongue 124 is disposed within first opening 118 of mount 108. Second connector holder 128 is configured to retain second electrical connector 130 in an orientation facilitating alignment of second electrical connector 130 with the first electrical connector 120 when housing 106 is coupled to mount 108. Accordingly, as tongue 124 is disposed within first opening 118 of mount 108, first electrical connector 120 and second electrical connector 130 are electrically coupled, enabling an electrical current to flow between the electrical cable and electrical device 102.

Figure 7D:
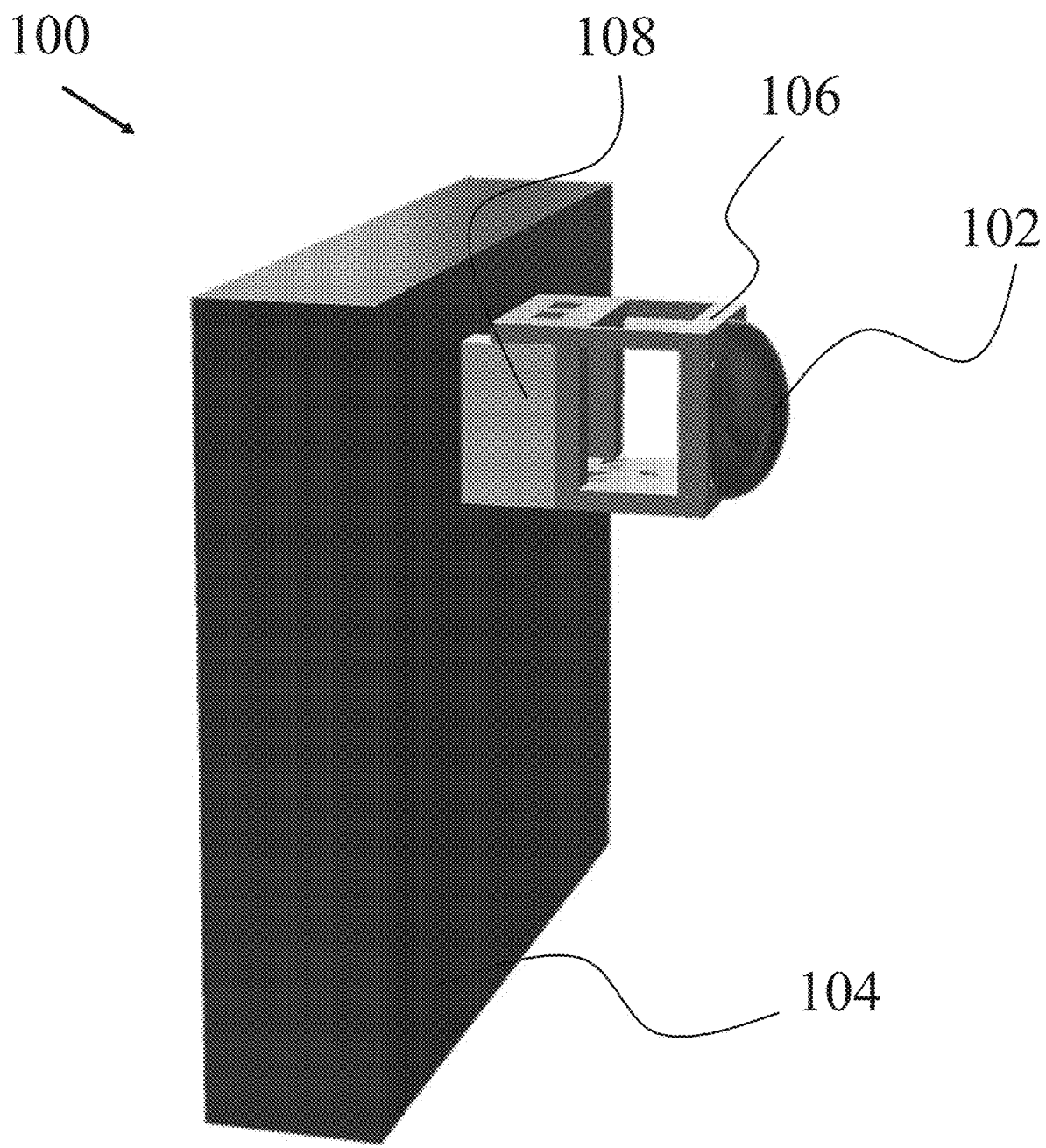
FIG. 7D is a perspective view of a housing, coupled to a mount, selectively decoupled from an elongated handle, according to an embodiment of the present disclosure.

FIG. 7D, in conjunction with FIGS. 6A-6B, depicts elongated handle 110 decoupled from housing 106, after housing 106 has been coupled to mount 108. As elongated handle 110 is decoupled from housing 106, locking member 146 transitions from disengaged position 150 to engaged position 148. In this manner, locking member 146 immobilizes housing 106 relative to mount 108. In this locked configuration, tongue 124 is unable to exit first opening 118 of mount 108.

As a safety feature, tether 138 may be coupled to housing 106. Tether 138 may have a first end 140, first end 140 configured to be affixed to housing 106, and a second end 142, second end 142 selectively anchored to an anchoring fixture 144. This feature ensures that housing 106 does not fall on the user after being disengaged from mount 108. As the user lowers housing 106, via elongated handle 110, tether 138 belays housing 106 such that housing 106 is configured to align with mount 108 on elevated support surface 104. Additionally, if elongated handle 110 malfunctions and selectively decouples from housing 106, housing 106 is held by anchoring fixture 144, inhibiting housing 106 from freefalling into ground surface.

Figure 8:
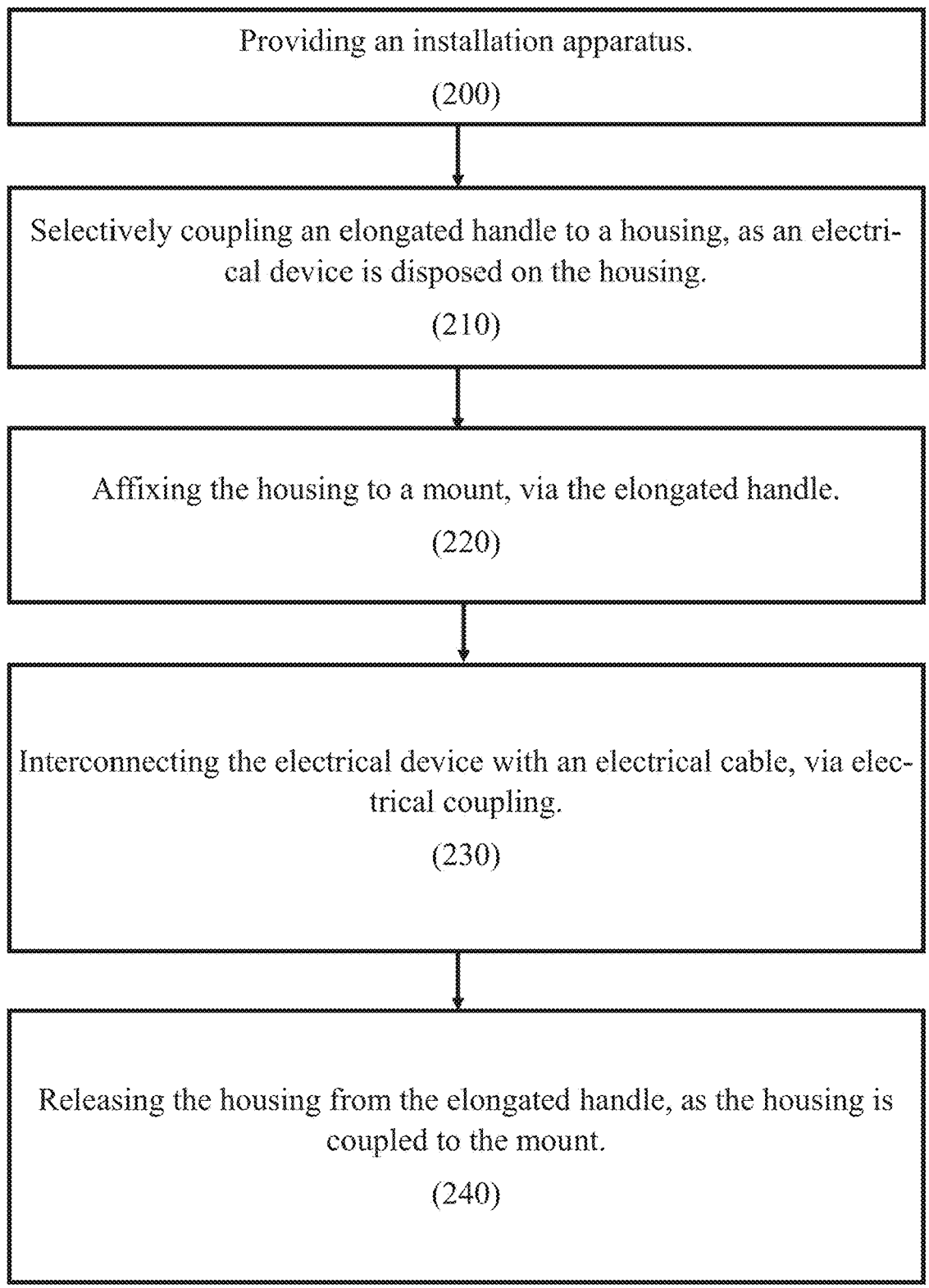
FIG. 8 is a flow chart depicting the steps of a method of mounting an electric device to an elevated surface with an installation apparatus.

Method of Use:

Referring now to FIGS. 1-7D, in conjunction with FIG. 8, a method is depicted for mounting electric device 102 to elevated surface 104 via installation apparatus 100. The steps delineated are merely exemplary of a preferred order for mounting electric device 102 to elevated surface 104 via installation apparatus 100. The steps may be carried out in another order, with or without additional steps included therein. Additionally, the steps may be carried out with alternative embodiments of installation apparatus 100, as contemplated in the above description.

As shown in FIGS. 1-7D, in conjunction with FIG. 8, the method for mounting electric device 102 to elevated support surface 104, via an installation apparatus 100 begins with step 200, providing installation apparatus 100. The next step, step 210, comprises selectively coupling elongated handle 110 to a housing 106. At step 220, housing 106 is affixed to mount 108, via elongated handle 110 and, subsequently, at step 230, electrical device 102 is interconnected with the electrical cable, via electrical coupling. Finally, at step 240, housing 106 is released from elongated handle 110, as housing 106 is coupled to mount 108.

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. An installation apparatus for mounting an electrical device onto an elevated support surface, comprising:
    a mount configured to be affixed to the elevated support surface, the mount having a distal portion and a proximal portion, wherein the distal portion and the proximal portion are separated by a first distance forming a first opening therebetween;
    a first connector holder coupled to the mount, the first connector holder configured to retain a first electrical connector, the first electrical connector being in electrical communication with an electrical cable;
    a housing configured to be coupled to the electrical device, the housing having a tongue having a width less than the first distance, whereby the tongue is configured to enter the mount through the first opening between the distal and proximal portions thereof;
    a second connector holder coupled to the housing, the second connector holder configured to retain a second electrical connector, wherein the second electrical connector is in electrical communication with the electrical device, and wherein the second connector holder is configured to retain the second electrical connector in an orientation facilitating alignment of the second electrical connector when the housing is coupled to the mount, such that the second electrical connector and the first electrical connector become electrically coupled with one another when the tongue of the housing is positioned between the distal and proximal portions of the mount, thereby enabling an electrical current to flow between the electrical cable and the electrical device; and
    an elongated handle having a proximal end and a distal end, the distal end configured to selectively couple to the housing, wherein the elongated handle enables a user to lift the housing to a position relative to the mount where the tongue of the housing is aligned with the first opening of the mount, whereby the tongue enters the first opening, thus coupling the housing to the mount.

2. The installation apparatus of claim 1, wherein the distal end of the elongated handle is configured to couple to the housing by a coupling mechanism selected from a group consisting of selected from a group consisting of a screw-threaded engagement, a magnetic engagement, a bias pin, a friction fit, and a combination of thereof.

3. The installation apparatus of claim 2, wherein an edge of the tongue is beveled to facilitate entry of the tongue into the first opening.

4. The installation apparatus of claim 1, wherein the elevated support surface is a wall, a post, or a ceiling.

5. The installation apparatus of claim 1, further comprising a locking member, the locking member having an engaged position in which the locking member immobilizes the housing relative to the mount and a disengaged position in which the tongue of the housing is removable from mount via the first opening thereof.

6. The installation apparatus of claim 5, wherein coupling of the distal end of the elongated handling to the housing transitions the locking member into the disengaged position, thereby releasing the housing from the mount.

7. The installation apparatus of claim 6, wherein the locking member is selected from a group consisting of a biasing component, a threaded screw, a switch, a bias pin, a stopper, a band, a clip, and a combination of thereof.

8. The installation apparatus of claim 1, wherein the elevated support surface is configured parallel with respect to a ground surface.

9. The installation apparatus of claim 1, further comprising a tether, wherein a first end of the tether is affixed to the housing and a second end of the tether is selectively anchored to an anchoring fixture, wherein when the second end of the tether is released from the anchoring fixture and the housing is removed from the mount, the housing and the electronic device affixed thereto is belayed via the tether.

10. A method for mounting an electrical device onto an elevated support surface using an installation apparatus comprising the steps of:
    selectively coupling an elongated handle to a housing, the electrical device being configured to be coupled to the housing;
    affixing the housing to a mount, via the elongated handle, the mount being configured to be affixed to the elevated support surface, wherein the mount has a distal portion and a proximal portion, whereby the distal portion and the proximal portion are separated by a first distance forming a first opening therebetween, and wherein the housing has a tongue having a width less than the second distance, whereby the elongated handle enables a user to lift the housing to a position relative to the mount where the tongue is aligned with the first opening, such that the tongue enters the first opening;

interconnecting the electrical device to an electrical cable, via electrical coupling, wherein the mount comprises a first connector holder coupled to the mount, the first connector holder configured to retain a first electrical connector, the first electrical connector being in electrical communication with the electrical cable, and wherein a second connector holder is coupled to the housing, the second connector holder configured to retain a second electrical connector, whereby the second electrical connector is in electrical communication with the electrical device, whereby the second connector holder is configured to retain the second electrical connector in an orientation facilitating alignment of the second electrical connector when the housing is coupled to the mount, such that the second electrical connector and the first electrical connector are electrically coupled with one another, thereby enabling an electrical current to flow between the electrical cable and the electrical device; and releasing the housing from the elongated handle, wherein the elongated handle is selectively decoupled from the housing, thereby releasing the elongated handle from the housing.

11. The method of claim 10, wherein the distal end of the elongated handle is configured to couple to the housing by a coupling mechanism selected from a group consisting of selected from a group consisting of a screwthreaded engagement, a magnetic engagement, a bias pin, a friction fit, and a combination of thereof.

12. The method of claim 10, wherein an edge of the tongue is beveled to facilitate entry of the tongue into the first opening.

13. The method of claim 10, wherein the elevated support surface is a wall, a post, or a ceiling.

14. The method of claim 10, further comprising locking the housing to the mount, via a locking member, the locking member having an engaged position in which the locking member immobilizes the housing relative to the mount and a disengaged position in which the tongue of the housing is removable from mount via the first opening thereof.

15. The method of claim 14, wherein coupling of the distal end of the elongated handling to the housing transitions the locking member into the disengaged position, thereby releasing the housing from the mount.

16. The method of claim 15, wherein the locking member is selected from a group consisting of a biasing component, a threaded screw, a switch, a bias pin, a stopper, a band, a clip, and a combination of thereof.

17. The method of claim 10, wherein the elevated support surface is configured parallel with respect to a ground surface.

18. The method of claim 10, further comprising anchoring the housing to the mount, via a tether, wherein a first end of the tether is selectively coupled to the housing and a second end of the tether is selectively anchored to an anchoring fixture, wherein when the second end of the tether is released from the anchoring fixture and the housing is removed from the mount, the housing and the electronic device affixed thereto is belayed with the tether.

19. The method of claim 18, further comprising replacing the housing, via the elongated handle, wherein the elongated handle is coupled to the housing enabling the user to remove the housing from the mount, whereby the housing is belayed from the mount to a ground surface, and wherein the first end of the tether and the elongated handle are selectively decoupled from the housing and subsequently selectively coupled to a replacement housing.

20. The method of claim 19, wherein the tether is selected from a group consisting of a dynamic rope, a static rope, an elastic string, a cable, and a combination of thereof.

* * * * *